US010410927B1

(12) United States Patent
Cheng

(10) Patent No.: US 10,410,927 B1
(45) Date of Patent: Sep. 10, 2019

(54) METHOD AND STRUCTURE FOR FORMING TRANSISTORS WITH HIGH ASPECT RATIO GATE WITHOUT PATTERNING COLLAPSE

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/042,357

(22) Filed: Jul. 23, 2018

(51) Int. Cl.
*H01L 27/12* (2006.01)
*H01L 21/8234* (2006.01)
*H01L 29/66* (2006.01)
*H01L 29/78* (2006.01)
*H01L 27/088* (2006.01)

(52) U.S. Cl.
CPC .. *H01L 21/823431* (2013.01); *H01L 27/0886* (2013.01); *H01L 29/6653* (2013.01); *H01L 29/66545* (2013.01); *H01L 29/785* (2013.01); *H01L 2029/7858* (2013.01)

(58) Field of Classification Search
USPC ....... 257/347, 57, 59, 72, 83, 257, 290, 351, 257/368, 392, E29.603, E29.295, 66, 257/E21.7; 438/30, 48, 128, 149, 151, 438/157, 161, 283
See application file for complete search history.

(56) References Cited

U.S. PATENT DOCUMENTS

| 9,893,166 | B2 | 2/2018 | Bergendahl et al. | |
|---|---|---|---|---|
| 9,923,080 | B1 | 3/2018 | Greene et al. | |
| 2006/0177977 | A1 | 8/2006 | Chan et al. | |
| 2012/0080747 | A1 | 4/2012 | Hong et al. | |
| 2017/0012000 | A1* | 1/2017 | Tseng | H01L 23/535 |
| 2017/0178969 | A1* | 6/2017 | Liaw | H01L 27/088 |
| 2017/0179275 | A1 | 6/2017 | Li | |
| 2017/0194426 | A1* | 7/2017 | Min | H01L 29/6681 |
| 2017/0372969 | A1 | 12/2017 | Ching et al. | |
| 2018/0102277 | A1 | 4/2018 | Cheng et al. | |

* cited by examiner

*Primary Examiner* — Niki H Nguyen
(74) *Attorney, Agent, or Firm* — Fleit Gibbons Gutman Bongini Bianco PL; Donna Flores

(57) ABSTRACT

A method for fabricating transistors comprises forming a fin above a semiconductor substrate; forming an isolation region with a dielectric material, the top surface of the isolation dielectric below the top of fin surface; depositing a dummy gate layer above the isolation region and surrounding the fin, a dummy gate hardmask layer on top of the dummy gate layer, a first hardmask material on top of the dummy gate hardmask layer above the fin and a second hardmask material on top of the dummy gate hardmask layer above the isolation region, the first hardmask material having a greater lateral etch than the second hardmask material; applying a gate patterning mask spaced equidistantly apart on top of the first and second hardmask materials; and etching the transistor to simultaneously form narrow active gates above and surrounding the fin and wide dummy gates above the isolation region.

20 Claims, 18 Drawing Sheets

METHOD AND STRUCTURE FOR FORMING TRANSISTORS WITH HIGH ASPECT RATIO GATE WITHOUT PATTERNING COLLAPSE

BACKGROUND

Field of Invention

The present disclosure generally relates to semiconductor manufacturing, and more particularly relates to a structure and method of fabrication for forming transistors with high aspect ratio gate (narrow/tall gate) without patterning collapse.

Description of the Related Art

Complementary metal-oxide-semiconductor (CMOS) scaling requires reduction in gate length (Lgate) to accommodate the reduction of pitch between adjacent gates (also known as contact gate pitch (CPP)). For example, for a 5 nm node FinFET or nanosheet transistor, the Lgate target is ~12 nm for a CPP of ~44 nm. In actual device fabrication, the dummy gate height is about 150 nm which makes transistor devices less stable mechanically.

In active nanosheet regions, dummy gates wrap around fins or nanosheets. Unlike gates in active fin or nanosheet region which are actually used electrically to control the transistor, dummy gates in isolation region (e.g., shallow trench isolation (STI) region) have no electrical function but are needed for patterning purposes. Therefore, nanosheets serve as mechanical anchors to hold gates stable in active regions. However, in shallow trench isolation (STI) regions, dummy gates sit directly on STI oxide. The aspect ratio of the dummy gates is greater than 10:1. It has been found that the instability of the high aspect ratio dummy gates on STI collapse and cause defect and yield issues.

Therefore, there is a need to reduce waste in transistor fabrication by producing transistors with a short Lgate without a gate collapsing issue.

BRIEF SUMMARY

In one embodiment, a method for fabricating transistors is disclosed. The method comprises forming a fin above a semiconductor substrate; forming an isolation region with a dielectric material, the top surface of the isolation dielectric below the top of fin surface; depositing a dummy gate layer above the isolation region and surrounding the fin, a dummy gate hardmask layer on top of the dummy gate layer, a first hardmask material on top of the dummy gate hardmask layer above the fin and a second hardmask material on top of the dummy gate hardmask layer above the isolation region, the first hardmask material having a greater lateral etch than the second hardmask material; applying a gate patterning mask spaced equidistantly apart on top of the first and second hardmask materials; and etching the transistor to simultaneously form narrow active gates above and surrounding the fin and wide dummy gates above the isolation region.

In another embodiment, a transistor device comprises a semiconductor substrate, a plurality of fins, an isolation area, at least one narrow active gate and a plurality of wide dummy gates. The plurality of fins are located above the semiconductor substrate. The isolation area is filled with dielectric in the semiconductor substrate in areas where the fins are not located. The at least one narrow active gate is located above and surrounding the fins. The plurality of wide dummy gates are located above the isolation area. The narrow active gate has a first width and the wide dummy gates have a second width which is greater than the first width.

BRIEF DESCRIPTION OF THE SEVERAL VIEWS OF THE DRAWINGS

The accompanying figures, where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

In this disclosure, a method and structure are provided for transistors with small gate length (Lgate) without dummy gate collapsing issue. An important feature of this invention is to simultaneously form narrow dummy gates in the nanosheet region and large dummy gates on the isolation region such as shallow trench isolation (STI) regions. A small Lgate around nanosheets enables nanosheet transistors with tight contact gate pitch (CPP), (i.e. small Lgate saves spacing for source/drain). A large Lgate in STI region reduces the aspect ratio of dummy gates and thus prevents dummy gate collapsing (i.e. no source/drain in STI region, so wide dummy gates are allowable).

This invention works for both FinFET and Nanosheet. The only difference is that in FinFET, the fin typically comprises the same semiconductor material such as silicon or silicon germanium. In a nanosheet transistor, the starting fin comprises a stack of silicon and silicon germanium. It should be noted that the term "fin" as used herein includes both a fin with a single material and a fin with a stack of materials such as a nanosheet stack.

In one embodiment, two different hardmasks are used. Amorphous silicon germanium (aSiGe) is used in the active area and amorphous Si (aSi) is used in the STI region for gate patterning. aSi and aSiGe have very similar patterning properties except that during reactive ion etch (RIE), aSiGe has more lateral etch than aSi. The RIE process is tuned to ensure the gate length in the active area defined by aSiGe meets the final Lgate target. As a result, a dummy gate in the STI region with aSi hardmask has a wider Lgate. Wide Lgates in the STI region reduces the aspect ratio of dummy gates, thus preventing gate collapsing issue.

Figure 1:
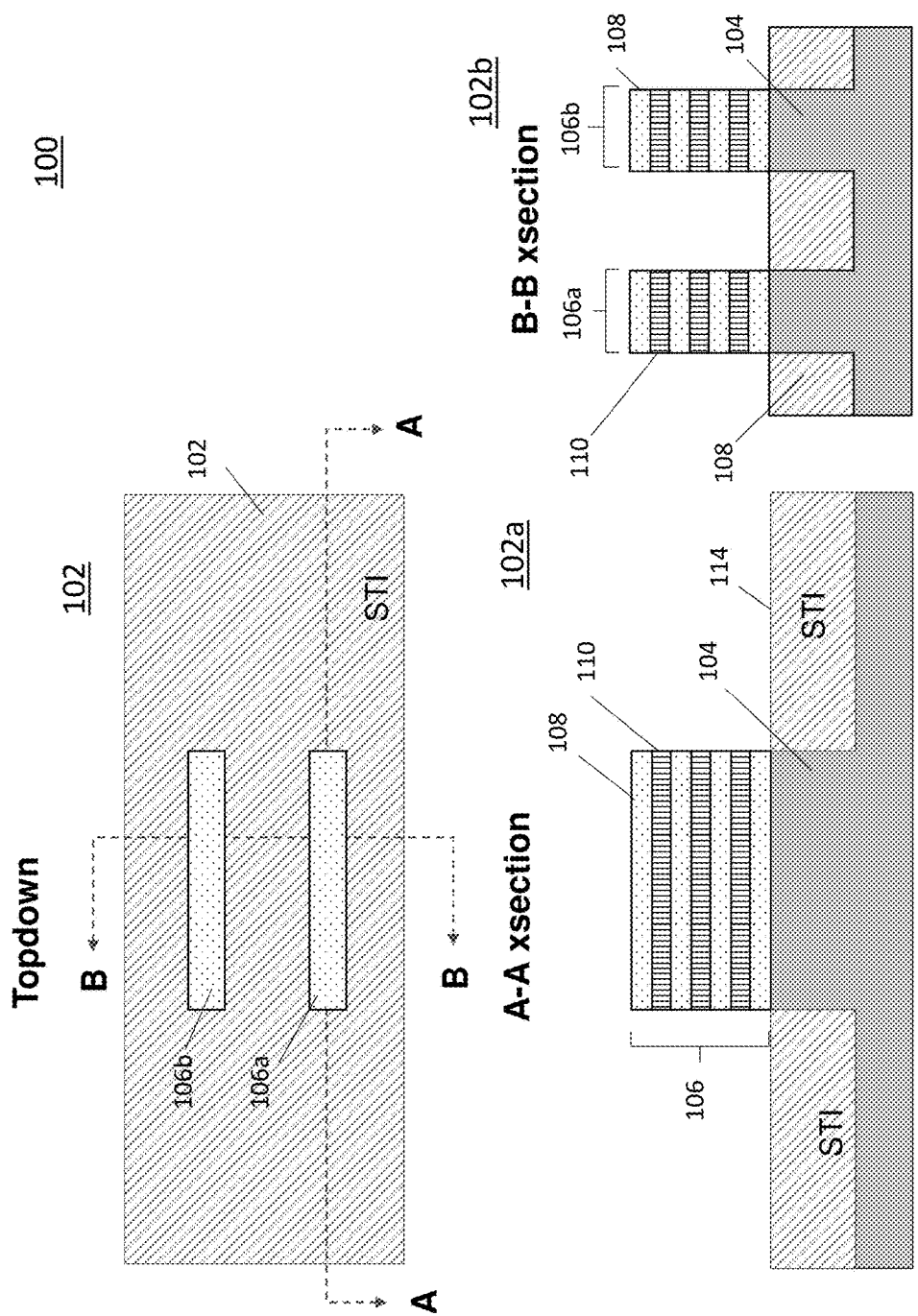
FIG. 1 is a cross-sectional illustration of a first stage transistor device according to one embodiment of the present invention.
Figure 2:
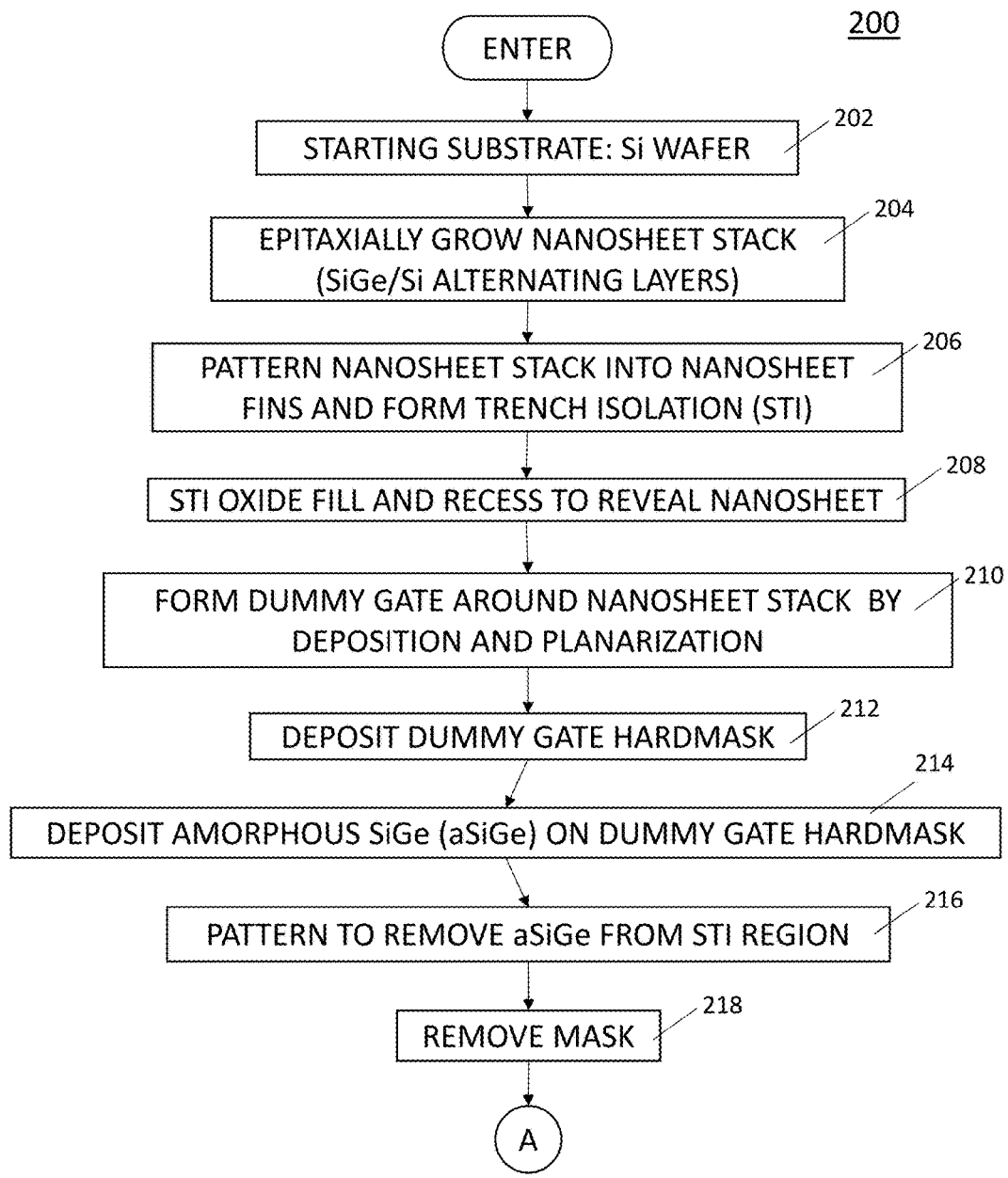
FIG. 2 is an operational flow diagram illustrating a process for manufacturing high aspect ratio gate transistors according to one embodiment of the present invention.
Figure 3:
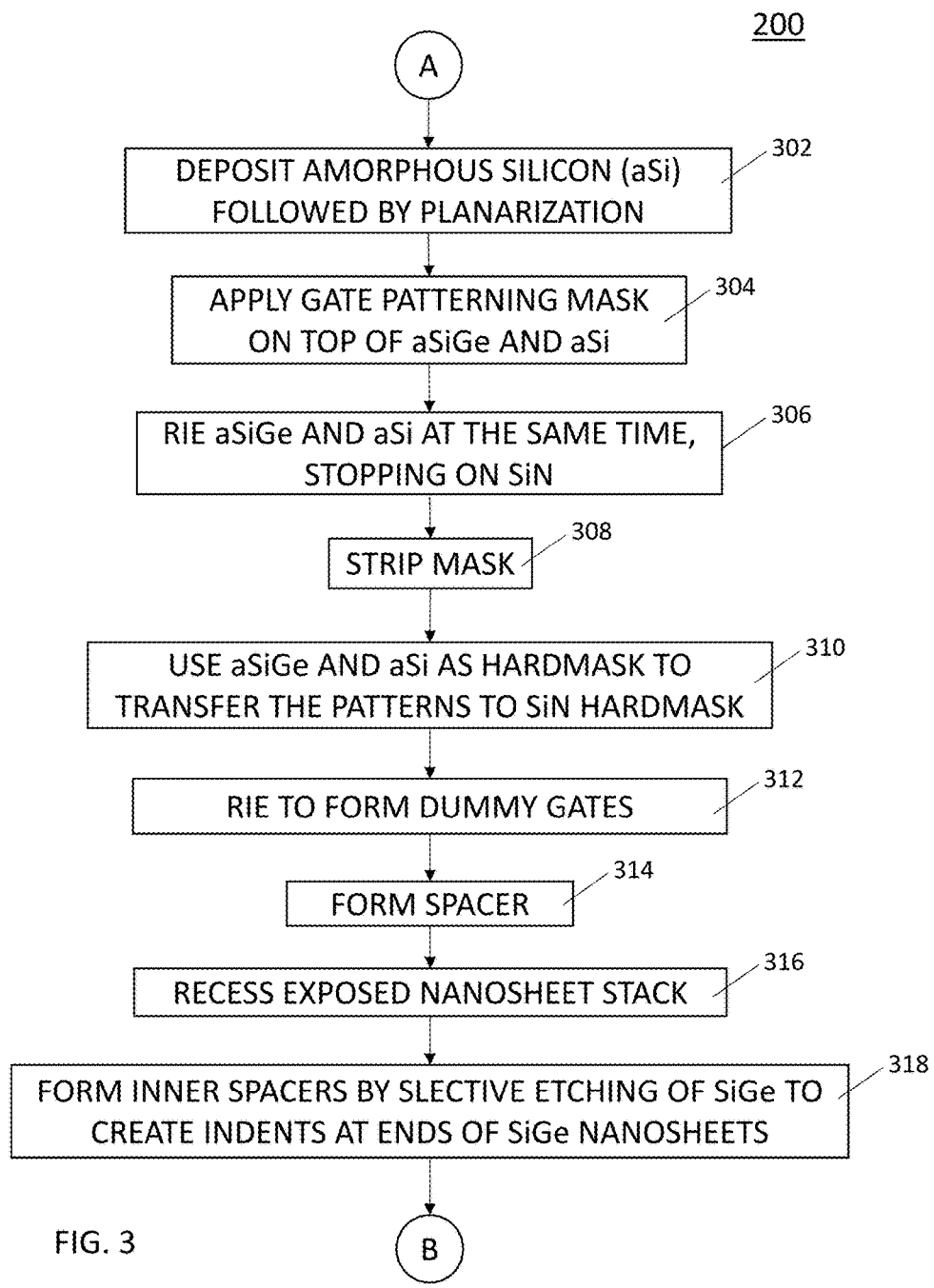
FIG. 3 is a continuation of the operational flow diagram of FIG. 2 illustrating a process for manufacturing high aspect ratio gate transistors according to one embodiment of the present invention.
Figure 4:
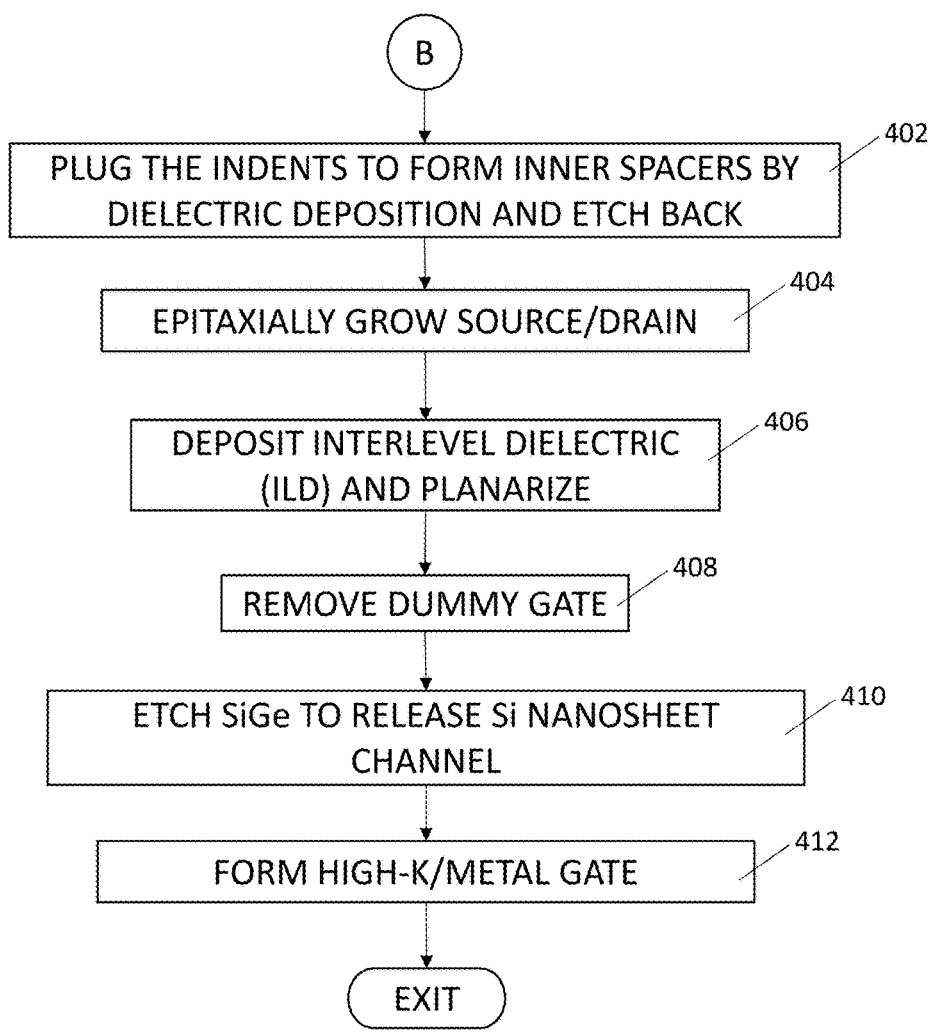
FIG. 4 is a continuation of the operational flow diagrams of FIGS. 2 and 3 illustrating a process for manufacturing high aspect ratio gate transistors according to one embodiment of the present invention.

Referring now to FIG. 1, a three-view drawing illustrating the beginning stages of producing a transistor 100 having a small Lgate without experiencing a dummy gate collapsing issue is provided. FIGS. 2 through 4 illustrate an operational flowchart 200-400 for a process of manufacturing a transistor with a small Lgate, according to one embodiment of the present disclosure. FIGS. 5 through 17 are cross-sectional illustrations showing the status of the transistor at various steps of the procedure. It should be noted that the drawings in FIGS. 1 and 5 through 17 are not to scale and are shown for illustrative purposes only. Although the process is described with respect to creating a single transistor, it should be obvious to one skilled in the art that the process creates a multitude of transistors over the entirety of a wafer. FIG. 1 shows the transistor from the top view 102, the front view 102a (shown as if cut along the line A-A from the top view 102) and the side view 102b (shown as if cut along the line B-B from the top view 102). However, for purposes of clarity, the mid-process views of FIGS. 5 through 16 are shown only from the front view.

The process begins, at step 202, by providing a starting semiconductor substrate, such as a silicon wafer 104. At step 204, the nanosheet stack 106 is epitaxially grown with alternating SiGe 108 and Si 110 layers. Although only a single SiGe 108 and Si 110 layer is denoted with a reference designator in FIG. 1, it should be noted that the layers alternate throughout the entirety of nanosheet stack 106 and the reference designators have not been displayed merely for clarity of the diagram. At step 206, the nanosheet stack 106 is patterned into nanosheet fins, as can be seen from side view 102b, and the trench isolation is formed. At step 208, the trench is filled with a dielectric (e.g., silicon oxide, referred as STI oxide) 114 and recessed to reveal the nanosheet fins 106a, 106b. In some embodiments (such as FinFET), the entire stack 106 can comprise the same material such as silicon or silicon germanium. If it is silicon, no epitaxy step is needed since the substrate is silicon. If it is silicon germanium, epitaxy growth of SiGe can be used. In some embodiments, the isolation trench can comprise two or more dielectric materials such as silicon nitride liner on trench sidewalls and silicon oxide in the rest of trench.

Figure 5:
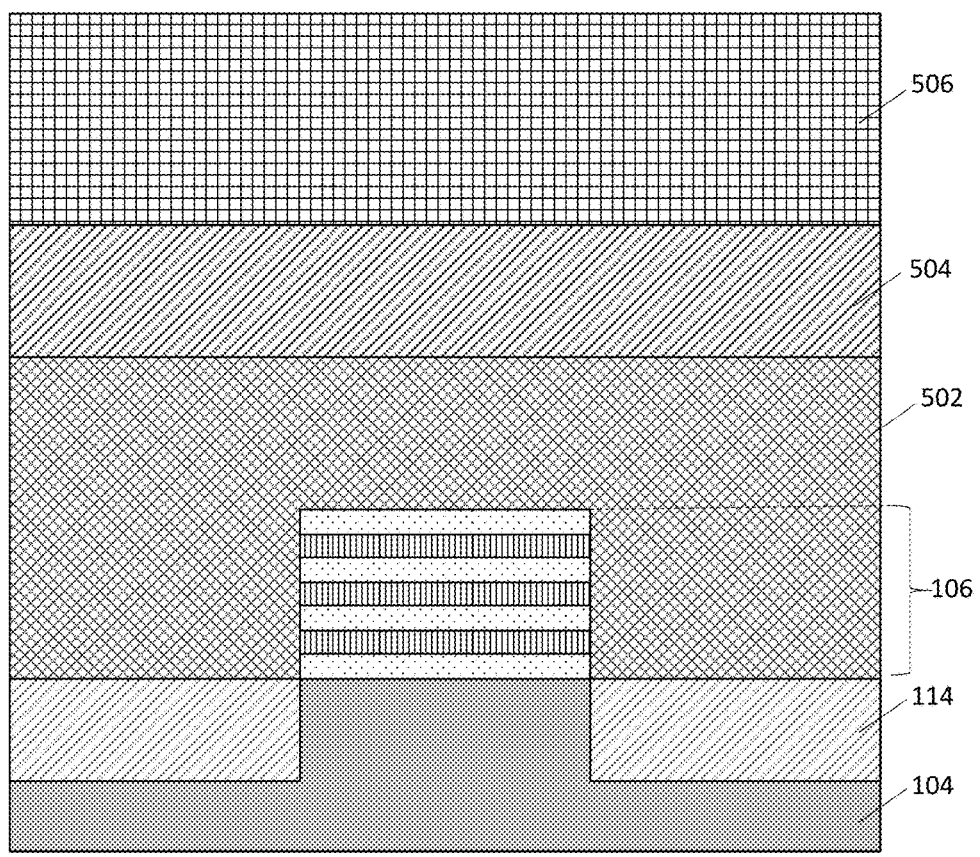
FIG. 5 is a cross-sectional illustration showing a high aspect ratio gate transistor through steps 210-214 of the operational flow diagram of FIG. 2.

At step 210, a dummy gate layer 502 is formed on top of the STI layer 114 and surrounding the nanosheet fins 106a, 106b, then planarizing, as shown in FIG. 5. In some embodiments, the dummy gate layer 502 comprises a dummy gate oxide (e.g., about 1.5 nm to 5 nm) on top of the STI layer 114 and surrounding the nanosheet fins 106a, and a dummy gate that comprises amorphous silicon or polycrystalline silicon. A dummy gate hardmask layer 504, such as silicon nitride (SiN), is deposited on top of the dummy gate layer 502, at step 212. At step 214, a first hardmask layer (e.g., an amorphous SiGe layer (aSiGe), or a polycrystalline SiGe layer) 506 is deposited above the dummy gate hardmask layer 504.

Figure 6:
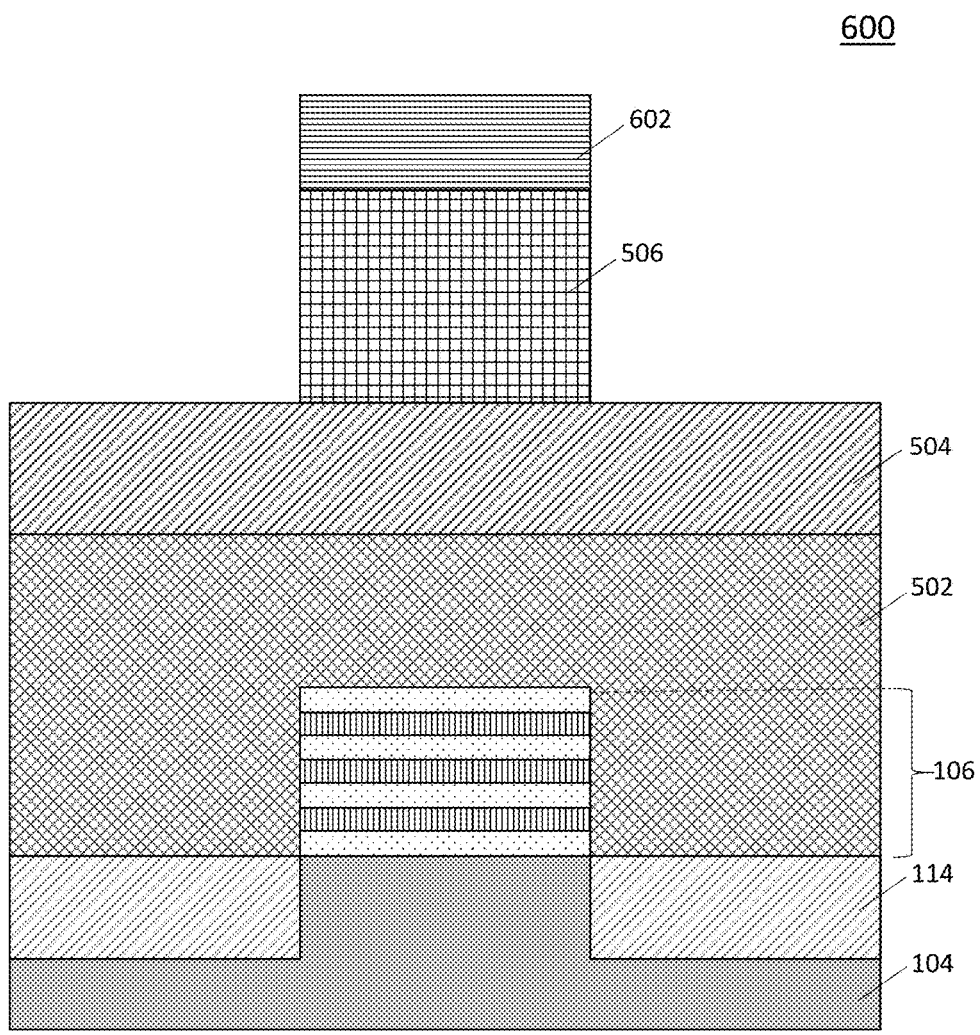
FIG. 6 is a cross-sectional illustration showing a high aspect ratio gate transistor at step 216 of the operational flow diagram of FIG. 2.

At step 216, the wafer 500 is patterned to remove the aSiGe layer 506 from everywhere in the STI region 114 except directly above the nanosheet fins 106a, 106b, as shown in FIG. 6. The aSiGe layer 506 may be removed, for example, by using a mask 602 (e.g., photoresist masking layer) via lithography and performing reactive ion etching (RIE) to remove the aSiGe layer 506 in areas not covered by photo resist 602. At step 218, the photo resist mask 602 is removed using techniques known in the art, leaving the aSiGe layer 506 exposed.

Figure 7:
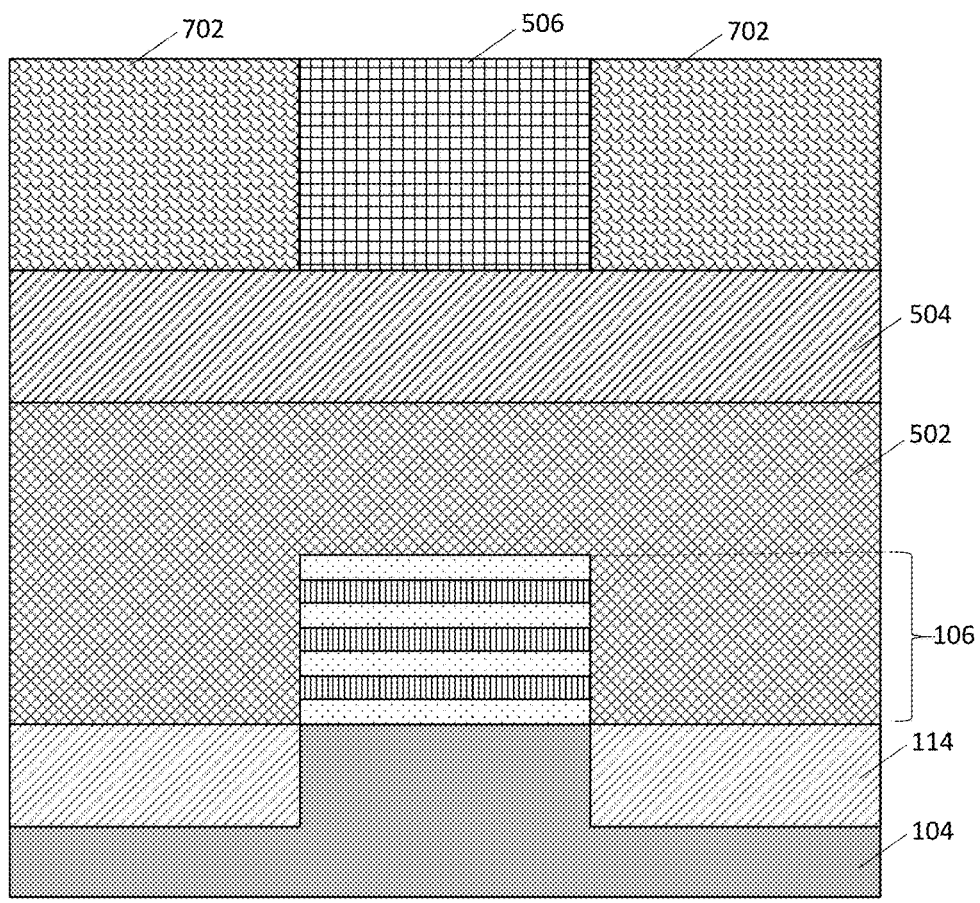
FIG. 7 is a cross-sectional illustration showing a high aspect ratio gate transistor through step 210 of the operational flow diagram of FIG. 2 and step 302 of the operational flow diagram of FIG. 3.

Continuing the process in FIG. 3, at step 302, a second dummy gate hardmask layer (e.g., amorphous silicon (aSi), or polycrystalline silicon) 702 is deposited over the wafer 600, as shown in FIG. 7. The deposition is followed once again by planarization (e.g., chemical mechanical polish (CMP)) to form a smooth top surface wherein the top of both the aSiGe 506 and the aSi 702 are coplanar. As a result, the aSiGe layer 506 is directly above the nanosheet region 106 and an aSi layer 702 is directly above the STI region 114.

Figure 8:
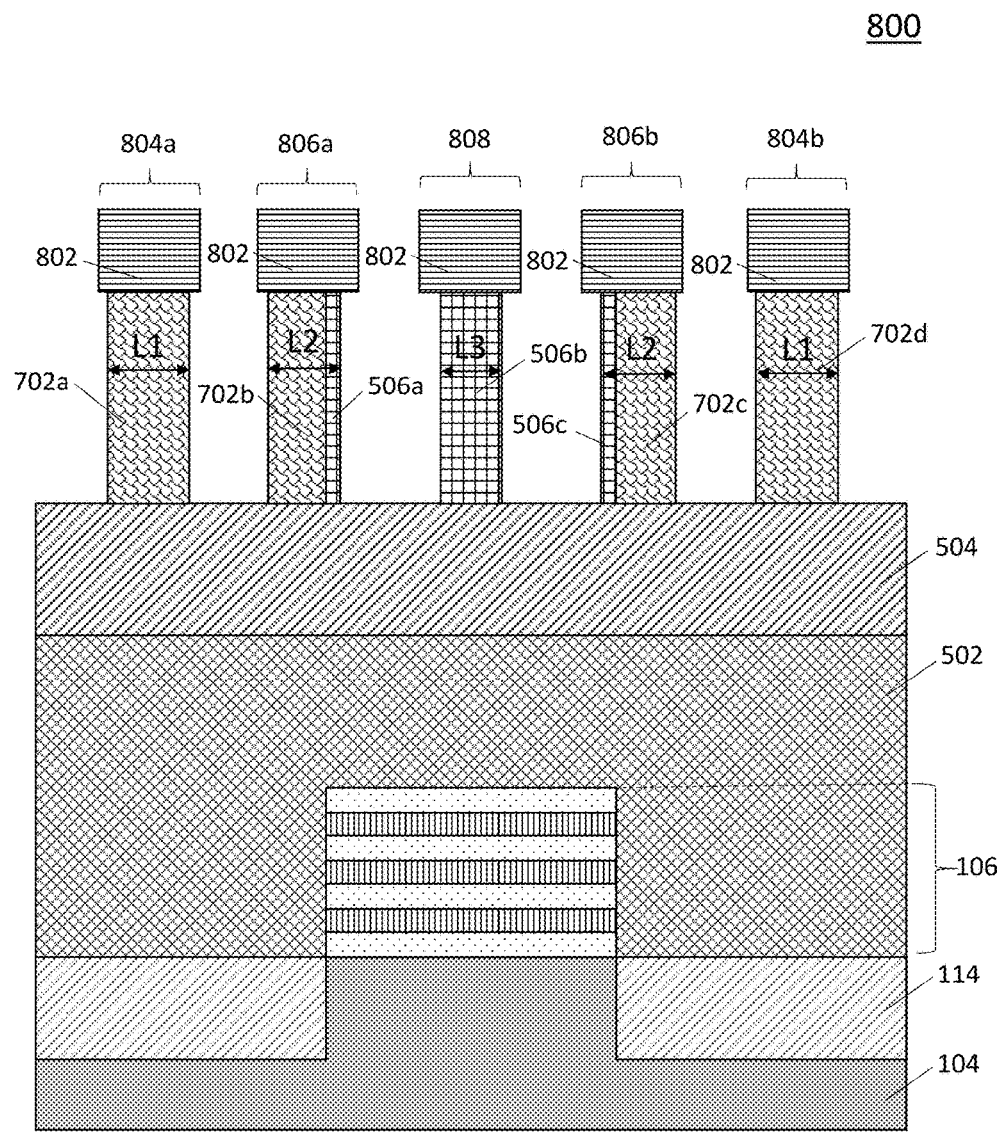
FIG. 8 is a cross-sectional illustration showing a high aspect ratio gate transistor through steps 304-306 of the operational flow diagram of FIG. 3.

At step 304, a gate patterning mask 802 is applied on top of the aSiGe layer 506 and the aSi layer 702. The patterning mask 802 can be a soft mask such as photoresist, optical planarization layer (OPL), or a hardmask (e.g., oxide). The patterning mask can be formed by deposition of the mask layer, performing photo lithography process, and followed by etching. Other suitable techniques, such as sidewall image transfer (SIT), self-aligned double patterning (SADP), self-aligned multiple patterning (SAMP), self-aligned quadruple patterning (SAQP) can be used to form the gate patterning mask 802. The gate patterning mask may contain blocks of photo resist that are spaced equidistantly apart. The wafer 800 is patterned (e.g., by reactive ion etch (RIE) process), at step 306, such that the aSiGe layer 506 and the aSi layer 702 are removed at the same time, stopping at the dummy gate hardmask layer 504, as shown in FIG. 8. It should be noted that the aSiGe layer 506 presents a more lateral etch as a result of the RIE process than does the aSi layer 702. Thus, there are naturally three types of gates formed. Dummy gates 804a, 804b formed from the aSi layer 702 have a wider length (L1) than boundary dummy gates 806a, 806b (which have a gate length L2) or active gate 808 made from the aSiGe layer 506 and having a gate length L3. It should be noted that L1>L2>L3. For example, L1 may be 20 nm, while L2 is 16 nm and L3 is only 12 nm. As it is desirable for the active gate 808 to have as small a gate with as possible while retaining physical stability, the surrounding dummy gates 804a, 804b, 806a, 806b help provide a better mechanical structure. Boundary dummy gates 806a, 806b, retain a small sliver of aSiGe 506a, 506c, while the greater portion is composed of aSi 702b, 702c. The result of step 306 is narrow aSiGe active gate pillars 808 and wide aSi dummy gate pillars 804a, 804b, 806a, 806b.

Figure 9:
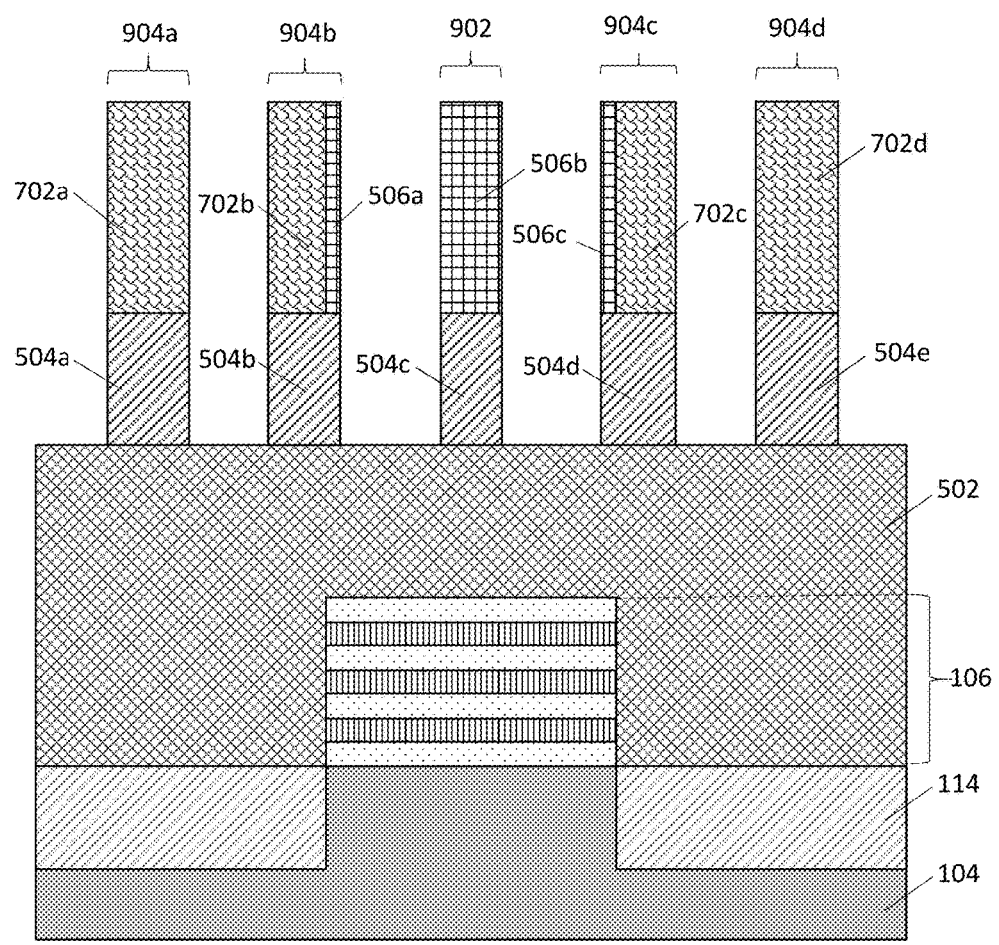
FIG. 9 is a cross-sectional illustration showing a high aspect ratio gate transistor through steps 308-310 of the operational flow diagram of FIG. 3.
Figure 10:
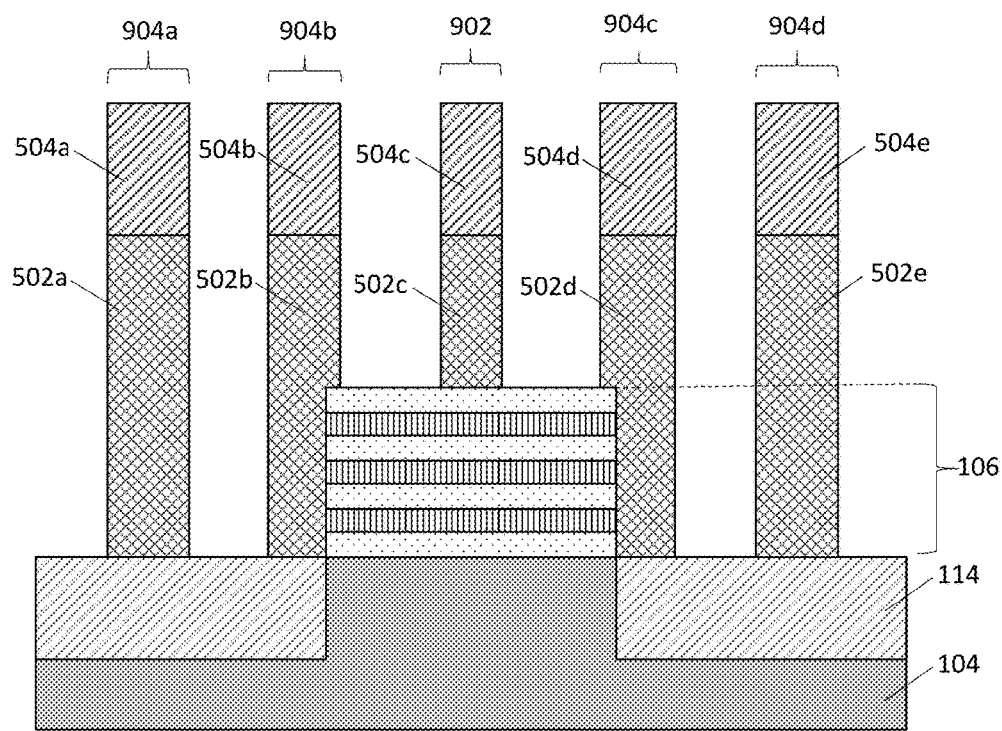
FIG. 10 is a cross-sectional illustration showing a high aspect ratio gate transistor at step 312 of the operational flow diagram of FIG. 3.

At step 308, the mask 802 is stripped from the wafer, as shown in FIG. 9. The aSiGe above active gate pillar 808 and the aSi and aSi/aSiGe combination above the dummy gate pillars 804a, 804b, 806a, 806b are used, at step 310, as a hardmask to transfer the patterns to the dummy gate layer 502. The wafer 900 is again patterned (e.g., by reactive ion etch), at step 312. The etching removes all the material through the dummy gate layer 502, stopping at the STI layer 114, as shown in FIG. 10. It should be noted that the aSi 702 and aSiGe 506 layers are completely consumed during the dummy gate RIE process.

Although the figures show a single layer for the dummy gate hardmask layer 504, alternatively, SiN with a $SiO_2$ underneath layer may be used instead of a single SiN layer as the hardmask. In this case, after transferring aSiGe/aSi patterns into SiN layer, aSiGe/aSi can be stripped (dummy gate is protected by SiO2). Then SiN is used as a hardmask to transfer the gate patterning into the dummy gate layer 502, resulting in an active gate 902 above the nanosheet region 106 and dummy gates 904a, 904b, 904c, 904d above the STI layer 114.

It should be noted that the dummy gates 904a, 904b, 904c, 904d on the STI layer 114 are wider than that the active gates 508 on the nanosheet stack 106 (i.e., L1>L2>L3). The wide dummy gates 904a, 904b, 904c, 904d above STI 114 reduce the aspect ratio (e.g., from 12.5:1 to 7.5:1), avoiding gate collapsing issue. The narrow active gates 902 in the nanosheet region 106 are anchored by the nanosheet fins 106a, 106b, so they do not have the collapsing issue in the first place. Although the active gates 902 on the nanosheet region 106 appear only on top of the nanosheet fins 106a, 106b, they actually wrap around the nanosheet stack 106 along the B-B direction from FIG. 1.

Figure 11:
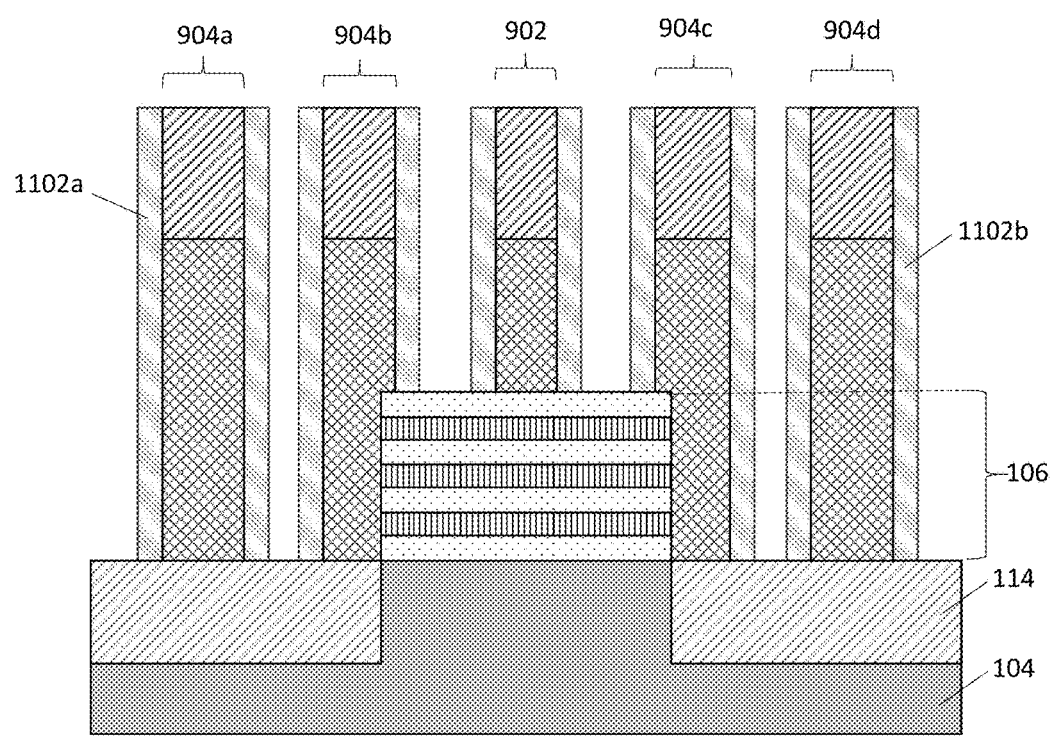
FIG. 11 is a cross-sectional illustration showing a high aspect ratio gate transistor at step 314 of the operational flow diagram of FIG. 3.

Referring back to FIG. 3, at step 314, spacers 1102a, 1102b are formed along the sides of active gate 902 and dummy gates 904a, 904b, 904c, 904d through deposition and RIE as shown in FIG. 11. Although only two spacers 1102a, 1102b are labeled with reference designators, it should be noted that a spacer 1003 is formed on each side of active gate 902 and dummy gates 904a, 904b, 904c, 904d and the reference designators were not shown in the figures for clarity. The spacer 1102 may be a low-k spacer, such as SiOCN or SIBCN, etc. Some examples of the spacer material include, but are not limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. The dielectric material can be a low-k material having a dielectric constant less than about 7, less than about 5. Spacers can be formed by any suitable techniques such as deposition followed by directional etch. Deposition may include but is not limited to, atomic layer deposition (ALD), chemical vapor deposition (CVD). Directional etch may include but is not limited to, reactive ion etch (RIE).

Figure 12:
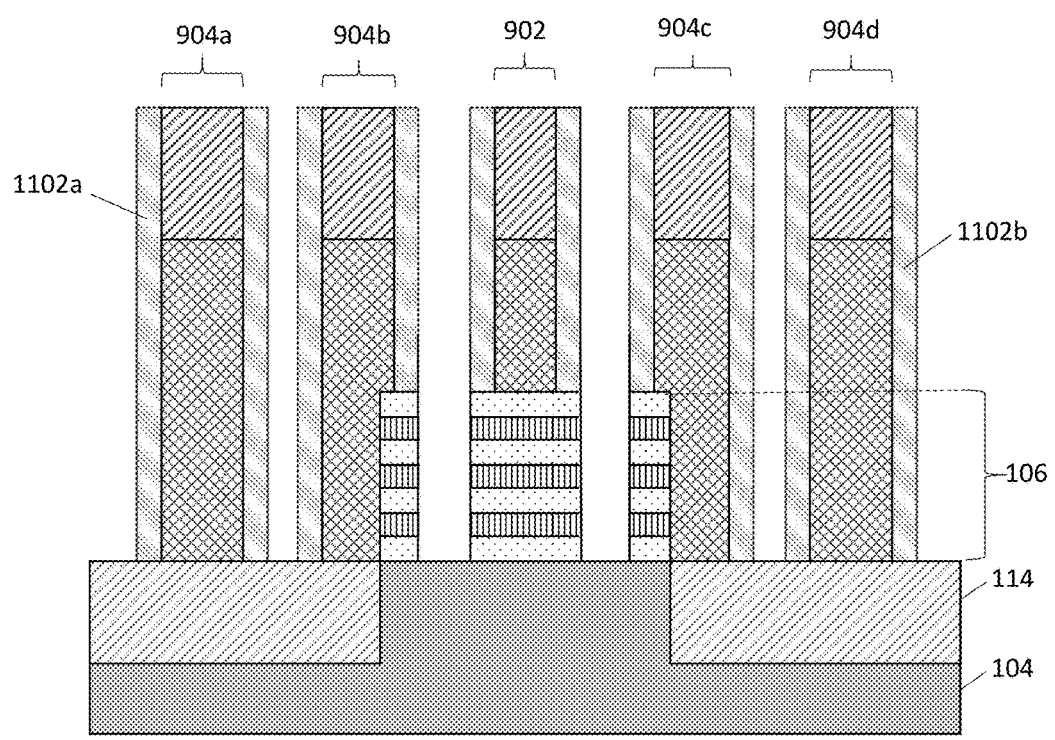
FIG. 12 is a cross-sectional illustration showing a high aspect ratio gate transistor at step 316 of the operational flow diagram of FIG. 3.
Figure 13:
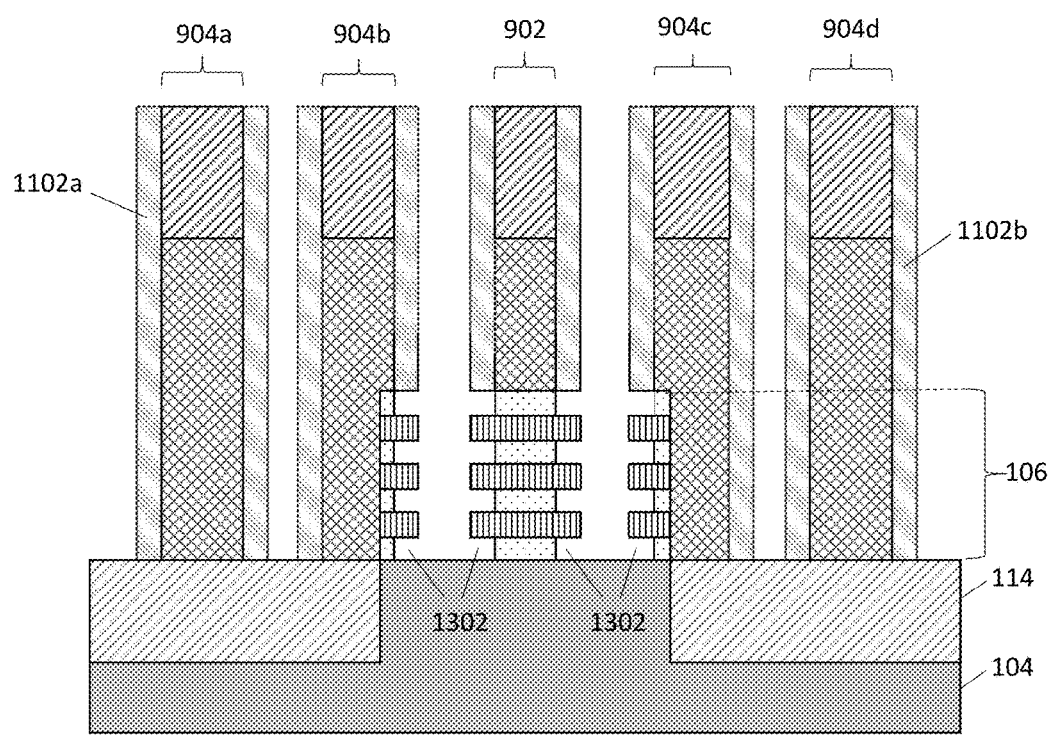
FIG. 13 is a cross-sectional illustration showing a high aspect ratio gate transistor at step 318 of the operational flow diagram of FIG. 3.

At step 316, the exposed nanosheet area (i.e. the nanosheet region 106 located between dummy gate 904b and active gate 902, and the nanosheet region 106 located between active gate 902 and dummy gate 904c) is recessed, for example, by reactive ion etch (RIE), as shown in FIG. 12. At step 318, inner spacers are formed by selective etching of the SiGe layer 108 in the nanosheet region 106 to create indentations 1302 at the ends of the SiGe nanosheets 108, as shown in FIG. 13.

Figure 14:
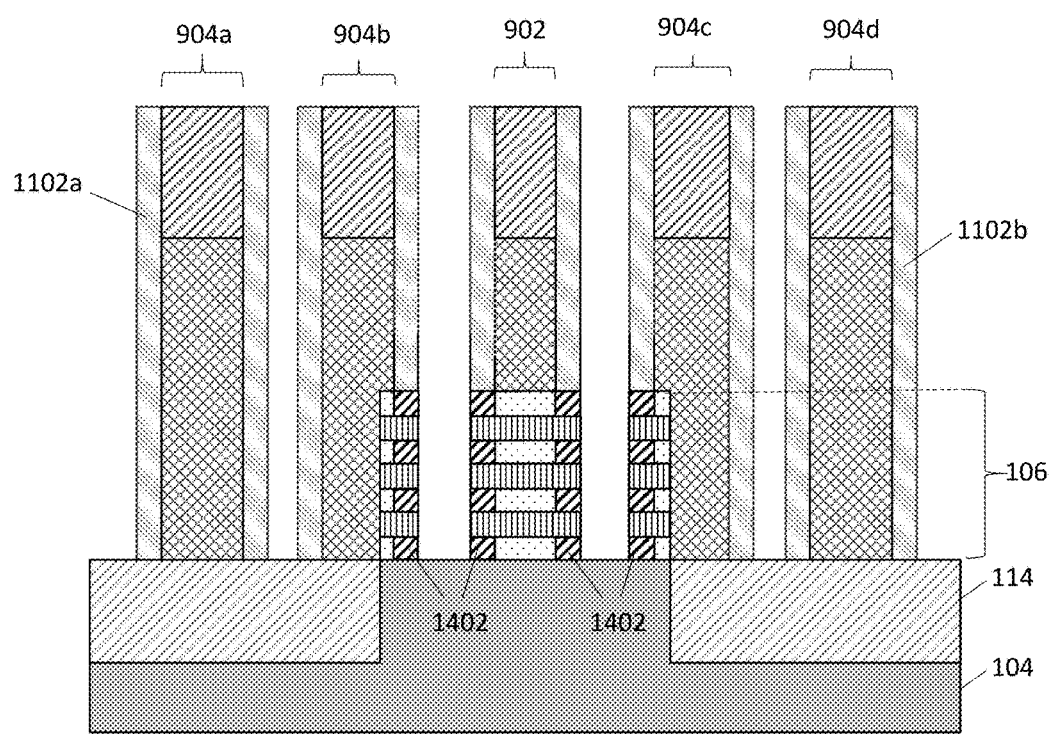
FIG. 14 is a cross-sectional illustration showing a high aspect ratio gate transistor at step 402 of the operational flow diagram of FIG. 4.
Figure 15:
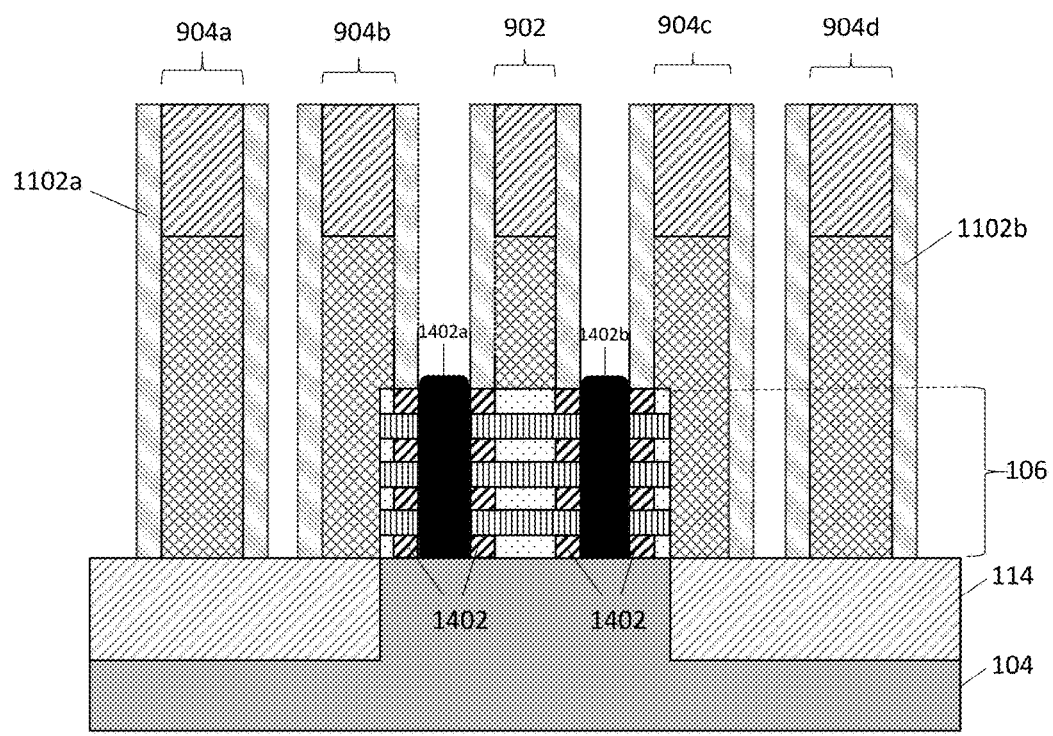
FIG. 15 is a cross-sectional illustration showing a high aspect ratio gate transistor at step 404 of the operational flow diagram of FIG. 4.

Continuing the process in FIG. 4, at step 402, the indents are plugged to form inner spacers 1402 by dielectric deposition and etch back, as shown in FIG. 14. The deposition may be formed, for example, from SiN. At step 404, source/drain regions 1502a, 1502b are epitaxially grown, as shown in FIG. 15. The source/drain regions 1502a, 1502b may be composed of, for example, boron-doped SiGe for pFET and phosphorus-doped Si for nFET.

Figure 16:
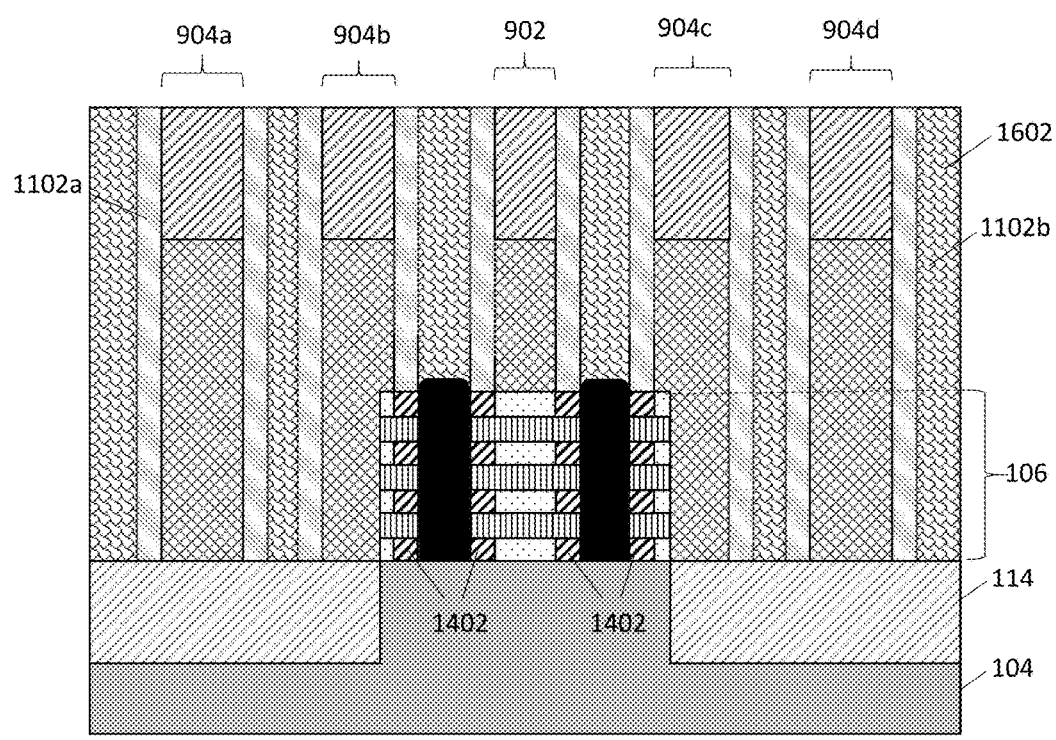
FIG. 16 is a cross-sectional illustration showing a high aspect ratio gate transistor at step 406 of the operational flow diagram of FIG. 4.
Figure 17:
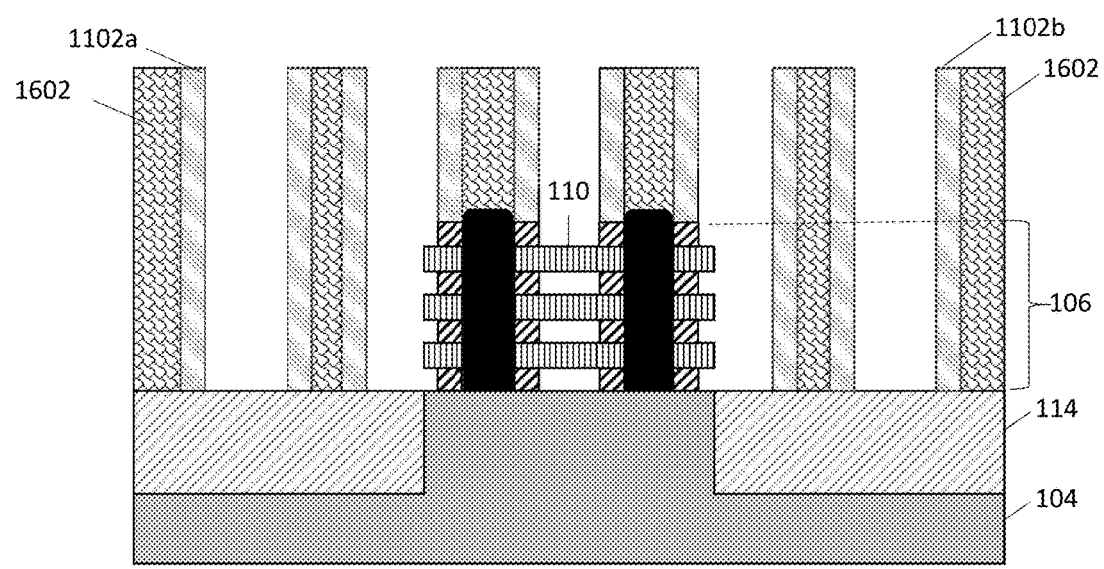
FIG. 17 is a cross-sectional illustration showing a high aspect ratio gate transistor through steps 408-410 of the operational flow diagram of FIG. 4.

At step 406, interlevel dielectric (ILD) 1602 is deposited and planarized, as shown in FIG. 16. At step 408, the gates 902, 904a, 904b, 904c, 904d are removed by RIE and/or isotropic etch, as shown in FIG. 16. The SiGe nanosheets 108 are etched using gas phase hydrogen chloride (HCl) or a wet-etch (e.g., an aqueous solution containing a mix of ammonium or hydrogen peroxide) to release Si nanosheets channels 110, as shown in FIG. 17.

Figure 18:
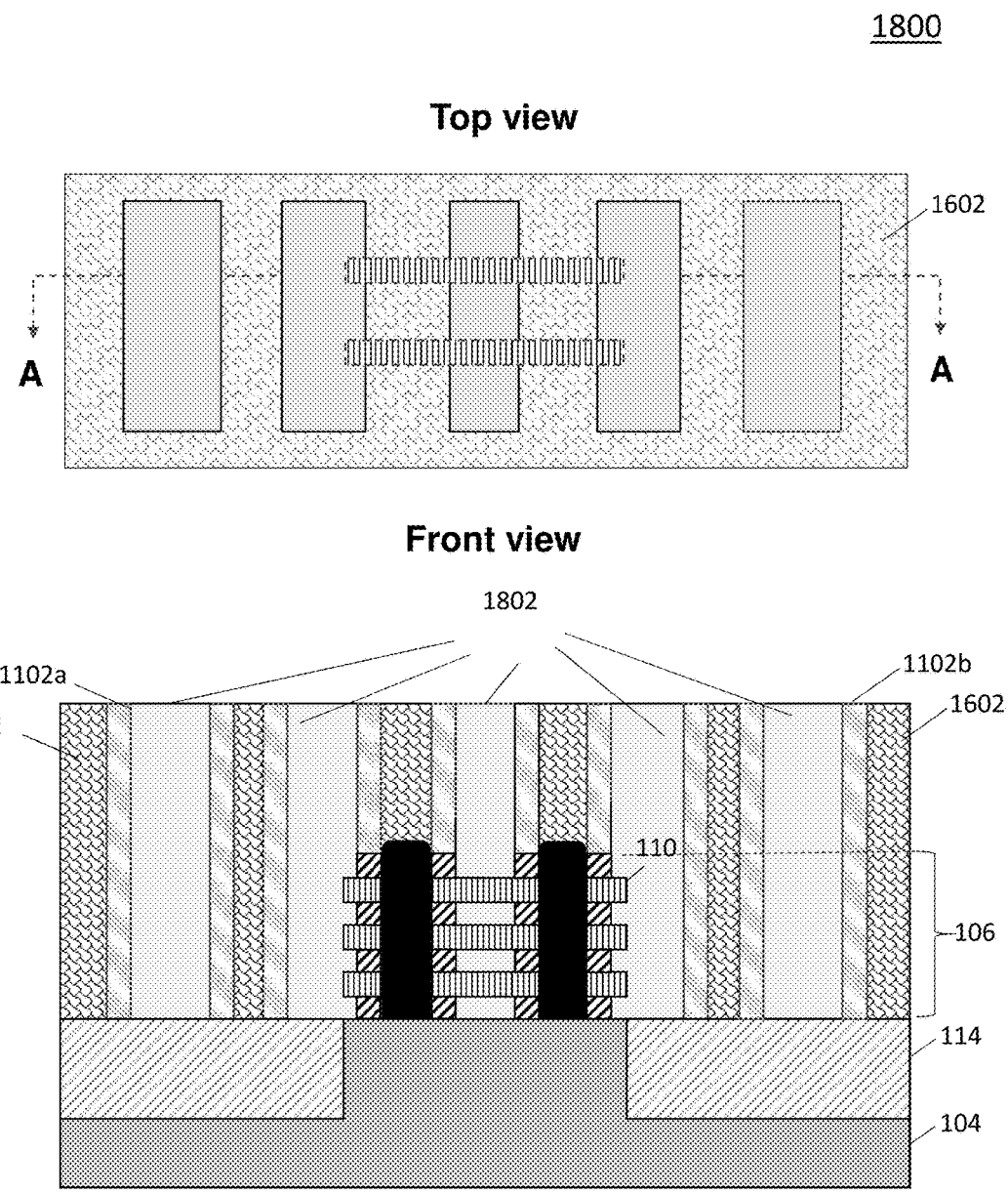
FIG. 18 is a cross-sectional illustration showing a final high aspect ratio gate transistor at step 412 of the operational flow diagram of FIG. 4.

The final transistor structure 1800 is shown in FIG. 18. At step 412, the transistor 1800 is completed by depositing a gate dielectric around nanosheet followed by metal gate on gate dielectric to form the final gates 1802 having two pieces, gate dielectric and gate conductor.

Gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

Gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

By using aSi and aSiGe hardmasks, all gates, which have different widths, are formed simultaneously with the same patterning process. The final transistor has a narrow active gate and wide dummy gates formed simultaneously with the same patterning process. The wide dummy gates prevent patterning collapse.

Non-Limiting Embodiments

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/ dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

The invention claimed is:

1. A method for fabricating transistors, comprising:
   forming a fin above a semiconductor substrate;
   forming an isolation region with a dielectric material, the top surface of the isolation dielectric below the top of fin surface;
   depositing a dummy gate layer above the isolation region and surrounding the fin, a dummy gate hardmask layer on top of the dummy gate layer, a first hardmask material on top of the dummy gate hardmask layer above the fin and a second hardmask material on top of the dummy gate hardmask layer above the isolation region, the first hardmask material having a greater lateral etch than the second hardmask material;

applying a gate patterning mask spaced equidistantly apart on top of the first and second hardmask materials; and etching the transistor to simultaneously form narrow active gates above and surrounding the fin and wide dummy gates above the isolation region.

2. The method of claim 1, wherein the fin comprises alternating sheets of silicon (Si) and silicon germanium (SiGe).

3. The method of claim 1, further wherein the gate patterning mask covers a portion of the fin and a plurality of portions of the isolation region.

4. The method of claim 1, wherein the first hardmask material is amorphous silicon germanium (aSiGe).

5. The method of claim 1, wherein the second hardmask material is amorphous silicon (aSi).

6. The method of claim 1, wherein dummy gate layer comprises a dummy gate oxide and a dummy gate on the dummy gate oxide.

7. The method of claim 1, wherein the dummy gate hard mask layer comprises silicon nitride (SiN).

8. The method of claim 1, wherein the fin comprises a silicon fin.

9. The method of claim 1, wherein etching the transistor comprises:

reactive ion etching the transistor to simultaneously remove the first hardmask material and the second hardmask material down to the dummy gate hardmask layer;

stripping the gate patterning mask;

using the first hardmask material and the second hardmask material to transfer the gate patterning to the dummy hardmask layer;

reactive ion etching the transistor to remove the dummy gate hardmask layer and the dummy gate layer below the first and second hardmask materials to form narrow pillars above the fin and wide pillars above the isolation region and leaving gaps between the pillars which expose portions of the fin and the isolation region;

forming spacers along each side edge of the narrow and wide pillars;

recessing the exposed fin down to the isolation region;

epitaxially growing source/drain material where the exposed fin was recessed;

depositing an interlevel dielectric in the gaps between the narrow and wide pillars;

removing the dummy gate hardmask layer and the dummy gate layer that form the narrow and wide pillars; and depositing a high-k gate dielectric and metal gate where the pillars were removed to form the narrow active gates above and surrounding the fin and the wide dummy gates above the isolation region.

10. The method of claim 9, wherein the high-k gate dielectric comprises hafnium oxide.

11. The method of claim 9, wherein at least one block mask layer covers a small portion of the fin and a larger portion of the isolation region, a boundary gate pillar is formed underneath the at least one block mask layer.

12. The method of claim 11, wherein the wide pillars have a first width, the at least one boundary gate pillar has a second width and the narrow pillar has a third width, the first width is greater than the second width and the second width is greater than the third width.

13. A transistor device comprising:

a semiconductor substrate;

a plurality of fins above the semiconductor substrate;

an isolation area filled with dielectric in the semiconductor substrate in areas where the fins are not located;

at least one narrow active gate above and surrounding the fins, the narrow active gate having a first width; and a plurality of wide dummy gates above the isolation area, the wide dummy gates having a second width, the second width greater than the first width.

14. The transistor device of claim 13, wherein the fins comprise a stack of silicon nanosheets.

15. The transistor device of claim 13, further comprising at least one boundary gate partially located above the fins and partially located above the isolation area.

16. The transistor device of claim 15, wherein the at least one boundary gate has a third width, the second width is greater than the third width, and the third width is greater than the first width.

17. The transistor device of claim 16, further comprising source/drain material between the at least one narrow active gate and the at least one boundary gate.

18. The transistor device of claim 17, wherein the source/drain material is boron-doped SiGe for a pFET.

19. The transistor device of claim 17, wherein the source/drain material is phosphorus-doped Si for an nFET.

20. The transistor device of claim 13, wherein the at least one narrow active gate and the plurality of wide dummy gates comprise high-k gate dielectric and metal gate.

* * * * *